United States Patent
Mehta et al.

(10) Patent No.: US 8,923,087 B2
(45) Date of Patent: Dec. 30, 2014

(54) METHOD AND APPARATUS FOR DECREASING LEAKAGE POWER CONSUMPTION IN POWER GATED MEMORIES

(75) Inventors: Romeshkumar Bharatkumar Mehta, Pune (IN); Dharmesh Kishor Tirthdasani, Bangalore (IN); Srinivasa Rao Kothamasu, Bangalore (IN); Ravindra Bidnur, Bangalore (IN)

(73) Assignee: LSI Corporation, Milpitas, CA (US)

( * ) Notice: Subject to any disclaimer, the term of this patent is extended or adjusted under 35 U.S.C. 154(b) by 225 days.

(21) Appl. No.: 13/354,222

(22) Filed: Jan. 19, 2012

(65) Prior Publication Data
US 2013/0191665 A1    Jul. 25, 2013

(51) Int. Cl.
*G06F 1/30*    (2006.01)
*G06F 1/32*    (2006.01)

(52) U.S. Cl.
USPC ............ 365/227; 365/229; 713/322; 713/323

(58) Field of Classification Search
None
See application file for complete search history.

(56) References Cited

U.S. PATENT DOCUMENTS

| | | | |
|---|---|---|---|
| 5,426,755 A * | 6/1995 | Yokouchi et al. | 711/101 |
| 5,544,121 A * | 8/1996 | Dosaka et al. | 365/222 |
| 7,257,723 B2 | 8/2007 | Galles | |
| 7,989,847 B2 | 8/2011 | Becker et al. | |
| 8,004,310 B1 | 8/2011 | Tiwari | |
| 2010/0254202 A1 | 10/2010 | Asauchi | |
| 2010/0257327 A1 | 10/2010 | Kosugi | |
| 2010/0257436 A1 | 10/2010 | Asauchi | |
| 2011/0047316 A1 | 2/2011 | Farham et al. | |
| 2011/0138215 A1 | 6/2011 | Kojima | |
| 2011/0249291 A1 | 10/2011 | Tsuzuki et al. | |
| 2013/0191665 A1* | 7/2013 | Mehta et al. | 713/322 |

OTHER PUBLICATIONS

Etm_architecture_spec, Mar. 2005 (previously provided).*
Etm_architecture_spec.*

* cited by examiner

*Primary Examiner* — James G Norman
(74) *Attorney, Agent, or Firm* — Sheridan Ross P.C.

(57) ABSTRACT

A method of controlling a power mode of a memory device is provided, which includes providing a power mode control signal responsive to a control signal and frequency information. The control signal is provided by a processing device operatively coupled to the memory device. The frequency information is associated with a clock signal used to operate the processing device, and the power mode control signal is operative to control the power mode. The control signal includes a chip select (CS) signal and/or a wait-for-interrupt (WFI) signal, and the power mode includes a light sleep (LS) mode and/or a deep sleep (DS) mode. The frequency information represents a low frequency range, medium frequency range, and/or high frequency range. A corresponding computer-readable medium, power management controller, and electronic system are also disclosed.

24 Claims, 5 Drawing Sheets

METHOD AND APPARATUS FOR DECREASING LEAKAGE POWER CONSUMPTION IN POWER GATED MEMORIES

BACKGROUND

In conventional sub-micron designs, a multitude of components are integrated on System-on-Chip (SoC) products. These SoCs generally include one or more central processing units (CPUs) and associated memories, such as static random access memory (SRAM) or read only memory (ROM) in addition to several other components that are product and/or application specific.

In SoC designs, the size of embedded memory is typically in the order of megabytes. On processor-based SoC designs, cache and tightly coupled memories are commonplace. The current pace of memory technology has surpassed Moore's Law concerning the density and performance of integrated circuits by greater than a factor of two. Thus, in a typical SoC design, memories command a substantial amount of silicon, board real estate, and/or power. Further, the increasing demand for handheld devices, ranging from mobile phones to gaming devices, imposes a critical need for saving power.

Conventional memory technology includes power saving features, such as the so-called "light sleep," "deep sleep," and "shutdown" modes, each of which can be entered in response to providing an appropriate voltage level on a corresponding input of the memory device. For example, when a light sleep (LS) input on the memory device is active, the memory device will enter a low leakage mode, in which output pins on the memory device remain static. Similarly, when a deep sleep (DS) input on the memory device is active, power to the peripheral circuits of the memory device is removed, output pins of the memory device are pulled low, and contents of the memory device are retained in their current state. Likewise, when a shutdown (SD) input on the memory device is active, contents of the memory device are lost, and power is removed from peripheral circuits of the memory device and its core.

The on-chip memories (SRAM and ROM) are added to boost the performance of the CPU and thus the overall system. However, these memories, especially SRAMs, are usually large in size compared to ROM and consume a substantial amount of power, both in terms of dynamic and static power. Dynamic power is used to access memory by the CPU for operation of the on-chip devices. Thus, dynamic power is productive power. However, static power is technology dependent and has become very significant in sub-micron technology. Static power consumption is not productive and should be decreased. As a result, conventional memory devices generally provide various control options to decrease power consumption. Accordingly, these memories are referred to as power gated memories.

Standard power control modes include the light sleep (LS) mode, deep sleep (DS) mode, and shutdown (SD) mode. Typical input/output pins are shown in FIG. 1 for an SRAM 10. The various types of input pin include address (A), data (D), write enable (WE), chip select (CS), clock (CLK), light sleep (LS), deep sleep (DS), and shutdown (SD). The output pin type includes data (Q). The power consumption in each of these modes is less than that in an active mode when the memory device is fully functional. However, there is generally a significant difference in power consumption between these power saving modes. In general, power consumed in the LS mode is greater than power consumed in the DS mode, which is greater than power consumed in the SD mode due to the power control architecture of the memory device. The SD mode enables the greatest power saving, but results in data stored in the memory device being lost. Thus, the SD mode is used if the system is to stop operation completely. However, both LS and DS power modes allow the memory device to retain data and are thus very useful when the CPU and/or system is idle or in sleep mode since these modes permit resumption of normal operation without reloading the contents of memory.

SUMMARY

Various embodiments of the invention reduce power consumption of integrated circuits by using a method, computer-readable medium, controller, and electronic system. In this manner, embodiments of the invention beneficially reduce power consumption in memory systems.

In accordance with an embodiment of the invention, a method of controlling a power mode associated with a memory device is provided, which includes providing a power mode control signal. The power mode control signal is responsive to a control signal and frequency information, and the control signal is provided by a processing device. The processing device is operatively coupled to the memory device, and the frequency information is associated with a clock signal. The clock signal is used to operate the processing device, and the power mode control signal is operative to control the power mode associated with the memory device.

The control signal includes at least one of a chip select (CS) signal and a wait-for-interrupt (WFI) signal, and the power mode includes at least one of a light sleep (LS) mode and a deep sleep (DS) mode. The frequency information represents at least one of a low frequency range, a medium frequency range, and a high frequency range. The low frequency range represents a frequency range of 100 to 300 Megahertz (MHz), the medium frequency range represents a frequency range of 300 to 700 MHz, and the high frequency range represents a frequency range starting at 700 MHz.

The method includes coupling, operatively, a ground signal to a light sleep (LS) input associated with the memory device in response to the frequency information representing a low frequency range, and coupling, operatively, a chip select (CS) signal to a deep sleep (DS) input associated with the memory device in response to the frequency information representing the low frequency range. The method includes coupling, operatively, a chip select (CS) signal to a light sleep (LS) input associated with the memory device in response to the frequency information representing a medium frequency range, and coupling, operatively, a wait-for-interrupt (WFI) signal to a deep sleep (DS) input associated with the memory device in response to the frequency information representing the medium frequency range. The method includes coupling, operatively, a wait-for-interrupt (WFI) signal to a light sleep (LS) input associated with the memory device in response to the frequency information representing a high frequency range, and coupling, operatively, a ground signal to a deep sleep (DS) input associated with the memory device in response to the frequency information representing the high frequency range.

The following detailed description of embodiments of the invention is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
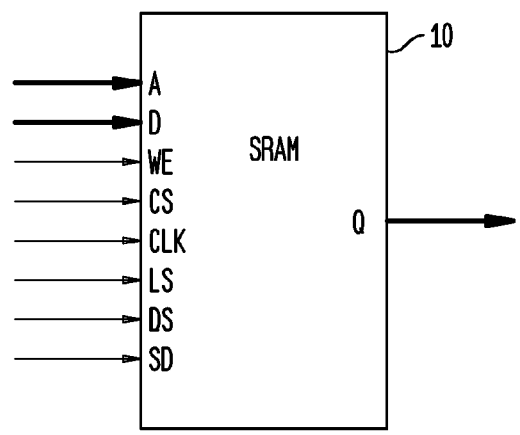
FIG. 1 is an input/output diagram of a static random access memory (SRAM) device.

It is to be appreciated that elements in the figures are illustrated for simplicity and clarity. Common but well-understood elements that are useful and/or necessary in a commercially feasible embodiment are not shown in order to facilitate a less hindered view of the illustrated embodiments.

DETAILED DESCRIPTION

The embodiments disclosed herein will be described in the context of illustrative power management controllers configured to enable power management features of memory devices. It should be understood, however, that the disclosed embodiments are not limited to these or any other particular circuit arrangements and/or methods. Rather, the embodiments are more generally applicable to techniques and devices to improve power management in a memory device while beneficially reducing leakage and dynamic power consumption by the memory device. Moreover, it will become apparent to those skilled in the art given the teachings herein that numerous modifications can be made to these embodiments while remaining within the scope of the disclosure. That is, no limitations with respect to the specific embodiments disclosed herein are intended or should be inferred.

Methods and devices are disclosed for use with System-on-Chip—(SoC) based systems to control selection of power saving modes in power gated memory devices, such as static random access memory devices (SRAMs), which are automated based on the operating mode of the SoC. These embodiments are hardware-based and do not require firmware interaction, thus reducing leakage power of the system without imposing a significant impact on performance.

Selecting a power saving mode reduces power consumption by the system. However, each power saving mode includes constraints in terms of how long it will take for memories to enter a particular power saving mode and how long it will take to recover system performance upon exiting that particular power saving mode. When the system enters a low power mode, the system can assert one of the power control signals, such as the light sleep (LS) input, deep sleep (DS) input, or shutdown (SD) input, and keep that power control signal asserted until an event causes the system to wake-up and become fully operational again. Once the power control signal is asserted, the system will typically not access memory for a reasonable period of time thereafter. Therefore, the time used to assert the power control signal and enter a power saving mode is not particularly critical from a system performance perspective. However, it is substantially more important from a system design standpoint to consider how much time it will take before the memory device becomes active following de-assertion of the power control signal. It is this time that impacts the response time and performance of the overall system, which is a primary factor in determining which power mode to be used.

Since the shutdown (SD) mode causes a loss of SRAM data, the SD mode is typically used prior to power being applied to the system since the system is not required to respond using the contents of memory at this time. Thus, the disclosed embodiments are primarily concerned with power control related to the light sleep (LS) and deep sleep (DS) modes since these modes are widely used for power saving during normal operation of the memory device. Table 1 below lists power consumption and wake-up times associated with a typical power gated SRAM in each of the LS and DS power modes.

TABLE 1

| Mode | Active | LS | DS | SD |
| --- | --- | --- | --- | --- |
| Static power (mW) | 9.04 | 3.35 | 1.63 | 0.98 |
| Wake-up time (ns) | 0 | 1.17 | 4.16 | 4.16 |

As shown in Table 1 above, modes that provide a greater savings in power generally require a longer wake-up time to re-activate the memory device. Also, as memory is generally not accessed continuously, it is possible to use periods of time during which the memory device is not being accessed, such as when the chip select (CS) signal is not asserted, to save power as long as switching into and out of the power mode is infrequent. If this type of switching is frequent, then the power saved by entering a reduced power mode is offset by the power used to toggle in and out of the reduced power mode. Thus, different signals are used to control entry into the power saving modes.

For example, in an advanced reduced instruction set computer (RISC) machine (ARM) processor-based SoC system, the chip select (CS) and wait-for-interrupt (WFI) signals are used to drive the power saving inputs (LS, DS, and SD) of the memory device(s). When the WFI signal is active, the processing core is in low power mode and the core will not access memory until an external event provides an interrupt. However, the WFI mode requires memory to be accessible within three to four cycles of the interrupting event.

The ARM architecture is a 32-bit reduced instruction set computer (RISC) instruction set architecture (ISA). ARM is referred to as the "advanced RISC machine" and is the most widely used 32-bit ISA in manufacturing volume. The relative simplicity of ARM processors makes them suitable for low-power applications. As a result, ARM processors have become dominant in the mobile and embedded electronics market as relatively low-cost, compact microprocessors and microcontrollers. In 2005, about 98% of the more than one billion mobile phones sold each year used at least one ARM processor. As of 2009, ARM processors account for approximately 90% of all embedded 32-bit RISC processor, and are used extensively in consumer electronics, including personal digital assistants (PDAs), mobile phones, digital media and music players, hand-held game consoles, calculators, and computer peripherals, such as hard drives and routers.

A system designer, assuming a minimum clock period of 1 nanosecond (ns), is able to decide: (1) not to use power gating memory, which will cause a power penalty, but will not affect system performance; (2) to use only one particular power mode, such as the LS mode, which allows memory to wake-up within one clock cycle; or (3) to use register-based programming of the LS and DS memory inputs under firmware control, thus enabling firmware to decide which power mode to use and which signal to connect to the LS or DS inputs.

However, the options provided above provide a compromise between higher power and higher performance. If no power control or only LS-based power control is performed, power consumption will be relatively high. If a firmware-based scheme is chosen, firmware performance will be reduced and firmware complexity will be substantially increased.

Given the power saving memory features, a logic circuit is used to drive the power saving input pins (LS, DS, and SD) of the memory device. One solution involves connecting an inverted chip select signal (~CS) to the LS and DS inputs, and holding the resulting signal inactive for a few additional clock cycles, which results in less activity and power consumption. However, in comparison with the CS setup time, the LS and DS setup times (or more specifically, the LS and DS fall recovery times) are quite large. For example, setup times for a Virage® SRAM (part number V111HDPWV4096M16X36B2L8HS) on a slow_125_0.81 corner (which is a process, voltage, temperature (PVT) corner at which the worst timing delay is exhibited and thus must be considered during design) are shown in Table 2.

TABLE 2

| Memory Specification | Setup Time (nanoseconds) | Setup time with respect to CS |
|---|---|---|
| CS setup time | 0.4092 | 1.0× |
| LS rise setup time | 0.1188 | 0.29× |
| LS fall setup time | 0.9174 | 2.24× |
| DS rise setup time | 0.3586 | 0.88× |
| DS fall setup time | 3.9226 | 9.59× |

One solution includes holding the LS input pin low or inactive-if the LS rise setup time specification cannot be met, and holding the LS input pin high or active if the LS fall setup time specification cannot be met. However, this solution eliminates the maximum benefit that could be achieved from utilizing the light sleep mode. Similarly, if the DS rise setup time specification cannot be met, the DS pin is tied low or inactive if the DS fall setup time specification cannot be met, and the DS pin is tied high or active if the DS fall setup time specification cannot be met. However, this solution eliminates the maximum benefit that can be obtained from utilizing the deep sleep mode. Thus, logic internal to the memory device used to implement these feature becomes redundant, which results in wasted chip real estate. To achieve power efficient designs, most if not all power saving features should be implemented. If this is not possible, memory devices without the unused features should be utilized, if available.

Another solution includes connecting an inverted CS (~CS) signal to the LS input in such a way that the currently accessed memory bank will be active while the remaining memory devices or bank(s), which are not currently being accessed, enter the light sleep mode. However, in this approach, there is some latency and/or wait states required when memory banks are switched, such as when a currently dormant (not currently being accessed) memory bank or device is to be accessed. Naturally, if a particular system configuration requires only one memory bank, this approach is inappropriate. A similar result occurs if the processor, to which the memory devices are attached, cannot operate with wait states, such as if cache memory is to be implemented.

Figure 2:
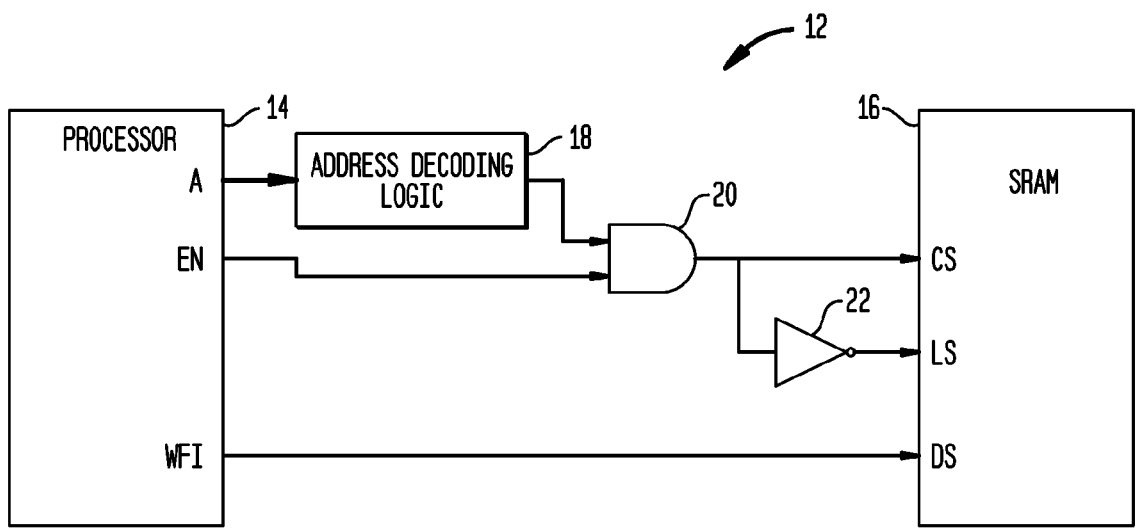
FIG. 2 is a block diagram of a first circuit embodiment to control power saving modes associated with the SRAM shown in FIG. 1.

An embodiment of a memory leakage power saving circuit 12 is shown in FIG. 2. The circuit 12 includes a processing device or processor 14, memory device 16, address decoding logic 18, AND gate 20, and inverter 22. Address signals output from the processor 14 are connected to the address decoding logic 18, the output of which is connected to the AND gate 20. The other input of the AND gate is connected to an enable (EN) signal of the processor 14, and the output of the AND gate 20 is connected to the CS input of the memory device 16 and an input of the inverter 22. An output of the inverter 22 is connected to the LS input of the memory device 16, and the WFI output of the processor 14 is connected to the DS input of the memory device 16. Thus, when the chip select (CS) signal to the memory device 16 is inactive, the light sleep (LS) signal is active and the memory device 16 is in the light sleep (LS) mode. When the wait-for-interrupt (WFI) signal from the processor 14 is active, the deep sleep (DS) signal is active and the memory device 16 is in the deep sleep (DS) mode.

The embodiments discussed below include a hardware-based logic design approach that provides for improved power saving without affecting system performance by selecting the appropriate power saving scheme automatically under hardware control. The following features provide these embodiments with features not in solutions, such as that shown in FIG. 2:

(1) use of multiple power saving modes for memory in which different inputs are coupled to the LS and DS inputs rather than static connections being made to these inputs;

(2) selection of an appropriate power saving scheme based on a current system operation mode, such as active, idle, and sleep; and (3) does not require processor or firmware programming of a power control register to select a particular power saving scheme.

The embodiments are based on the following features of SoC systems, such as those found in the ARM Cortex-R4 (CR4) processor, which is available from ARM Inc., 150 Rose Orchard Way, San Jose, Calif. 95134-1358;

(1) the processor system can operate at various frequencies based on the application being used at any given time, thus operating frequency is changed in accordance with performance requirements;

(2) the change in system clock frequency is obtained by programming a phase-locked loop circuit and using clock dividers to select the desired frequency; and (3) different signals, such as CS and WFI, are used in accordance with application requirements.

Though the example provided uses an ARM CR4-based system, the concepts disclosed are intended to be applicable to any system in which similar features are available as these features are generic across many processing devices.

The disclosed embodiments enable selection between multiple power saving modes based on a current operating frequency of the system. These modes assume zero wait-state processor-to-memory accesses since adding wait states would reduce the overall performance of the system. A typical set of modes that can be implemented for power saving in SRAM is shown in Table 3 below.

TABLE 3

| Mode of Operation | Freq Range (MHz) |
|---|---|
| Low Frequency | 100-300 |
| Medium Frequency | 300-700 |
| High Frequency | 700 and above |

At a high frequency range, such as about 800 MHz to 1.0 GHz, the CS signal toggles too quickly for even the LS mode to be used, since Table 2 illustrates that it takes more than 1 ns for the memory to wake-up, which can be more than 1 clock cycle for a processor running at 1.0 GHz. For example, assume a memory device is attached to a processor running at 1.0 GHz and memory light sleep/deep sleep timing specifications are 1.2 ns/6 ns, respectively. In a zero wait state memory system, memory is to provide data to the processor in the clock cycle following the clock cycle that the memory is being accessed. If the processor is running at a very high speed, such as 1.0 GHz, and the period of one clock cycle, which is 1.0 ns, is insufficient for the memory device to exit the LS mode, which is 1.2 ns, then the memory device will not be able to provide data to the processor within the necessary one clock cycle. Thus, using the CS signal to drive the LS input at such frequencies requires the memory device to use more than a single cycle to exit the LS mode, thus requiring that wait states be implemented. In such a case, the LS mode is entered in response to the CPU entering the WFI mode. However, the WFI (wait for interrupt) mode is not feasible because the memory device takes more than 4 clock cycles (which is the system requirement for responding after exiting the WFI mode) to exit the DS mode, which would also not satisfy the requirements for providing data to the processor from the memory device. Thus, a power scheme for the high frequency mode uses WFI to drive the LS input.

At a medium frequency range, such as about 300 MHz to 700 MHz, it is possible to use the CS signal to drive the LS input, and use the WFI output signal to drive the DS input since the operating clock period in this frequency range is longer than the operating clock period in the LS mode wake-up time. Operation in the medium frequency range would, therefore, enable a greater savings in power consumption.

At a low frequency range, such as about 200 MHz, it is possible to use the CS signal to drive the DS input since the memory device is able to wake up from the DS mode within one cycle at this frequency. However, the memory device should remain in the sleep mode for a sufficient period of time such that the amount of power used to enter and exit the sleep mode is minimal when compared to the power consumption saved during the deep sleep mode. Thus, different and more efficient power saving modes for memory systems are used based on the current operating frequency of the system to achieve substantially greater overall savings in power consumption. If these connections are made programmable through firmware, the software designer evaluates and programs the registers to achieve such power control. However, such power control requires a substantial amount of programming, a very detailed understanding of the hardware devices, and tedious attention to memory device parameters during the development of firmware.

Figure 3:
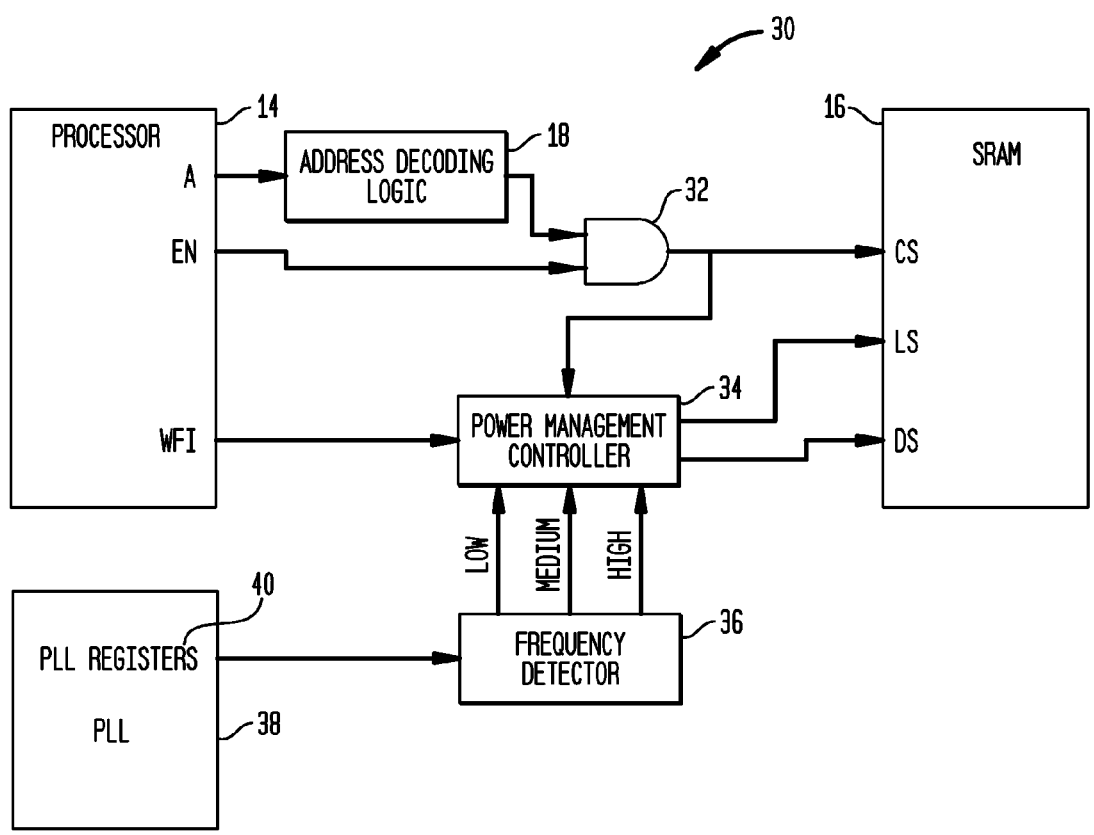
FIG. 3 is a block diagram of a second circuit embodiment to control power saving modes associated with the SRAM shown in FIG. 1.

A second embodiment of a circuit 30 for controlling reduced power modes associated with a memory device is shown in FIG. 3. The circuit includes the processor 14, memory device 16, address decoding logic 18, AND gate 32, power management controller 34, frequency detector 36, and phase-locked loop (PLL) circuit 38. Address signals from the processor 14 are connected to the address decoding logic 18, the output of which is connected to the AND gate 32. An enable signal from the processor 14 is connected to the remaining input of the AND gate 32, the output of which is connected to the CS input of the memory device 16 and an input of the power management controller 34. The WFI output signal of the processor 14 is connected to an input of the power management controller 34, the outputs of which are connected to the LS and DS inputs of the memory device 16. The values in the PLL registers 40, which determine characteristics, such as frequency, high time, and low time of the clock signal output from the PLL circuit 38, are provided to the frequency detector 36 so that the frequency mode can be determined. The low, medium, and high outputs of the frequency detector 36, which identify the frequency mode, are connected to the power management controller 34. The circuit 30 avoids firmware-based requirements and limitations, thus making the power selection scheme at least partially hardware-based. This implementation optimizes use of memory power gating without affecting firmware performance or requiring interaction therefrom.

The circuit shown in FIG. 3 exploits a basic feature of SoC designs that utilize the PLL-based clock circuit 38 to determine a clock frequency provided to the entire system. The PLL circuit 38 and associated PLL registers 40 are programmed with values that determine the clock frequency based on the current operating mode of the system, such as active mode, idle mode, sleep mode, and the like. The parameters to be programmed to obtain a particular frequency and their permissible values are determined before or after runtime or compilation, and are provided by the PLL circuit manufacturer.

The embodiment shown in FIG. 3 includes the frequency detector 36, which uses the programmable PLL register 40 values to determines the operating clock frequency range (such as low, medium, or high frequency range). This information is provided to the power management controller 34, which determines a power saving scheme, provides appropriate timing, and selectively connects the signals for driving the LS and DS inputs of the memory device 16 based on this information. The power management controller 34 includes programmable registers to allow selection of power saving schemes under firmware control as an option. However, the disclosed embodiment does not require firmware intervention to select a power saving scheme, and thus is completely automated.

Figure 4:
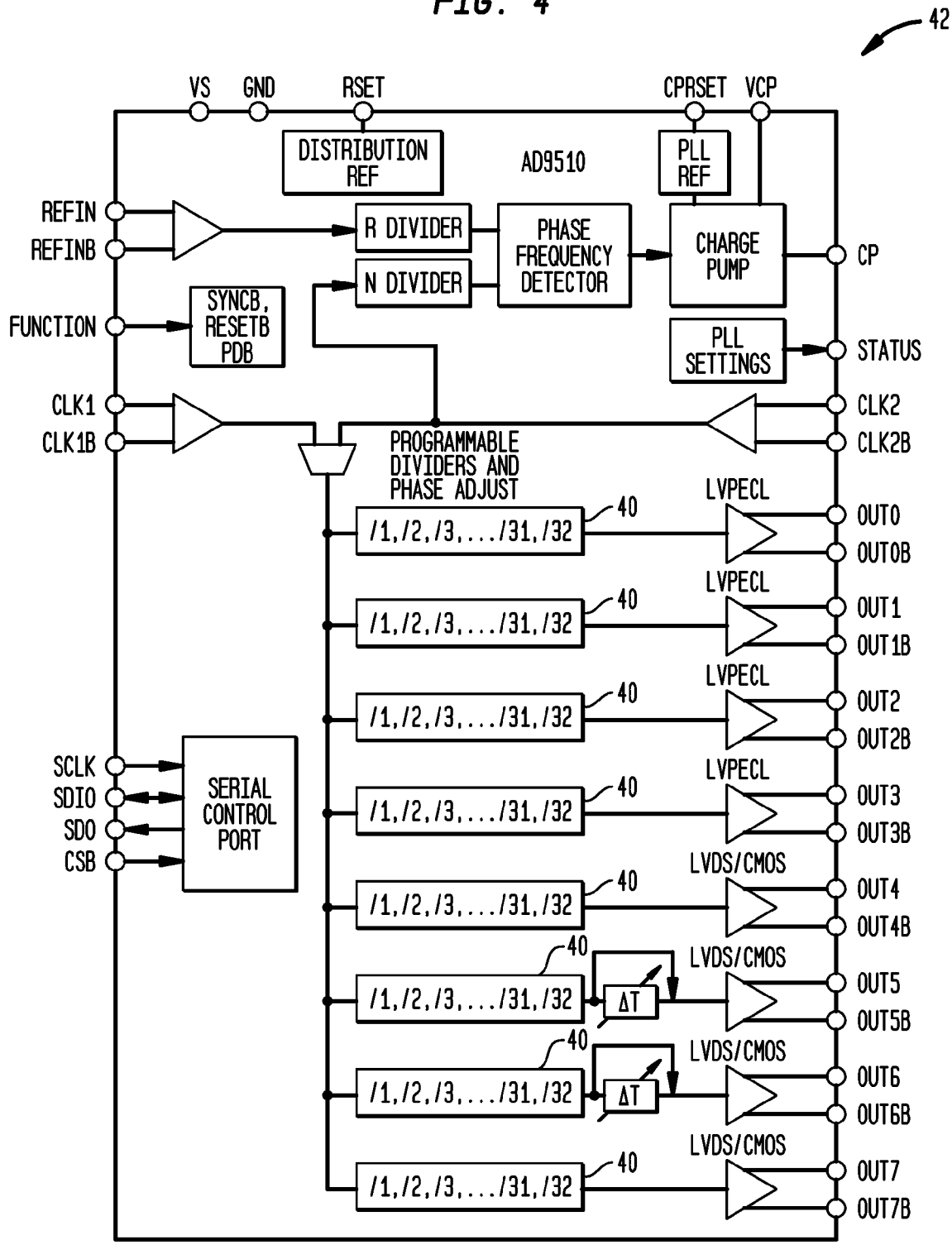
FIG. 4 is a block diagram of a multi-output clock distribution function with an on-chip phase-locked loop (PLL) core.

A device 42 to implement the phase-locked loop (PLL) circuit 38 is shown in FIG. 4 and is available from Analog Devices, Inc., 3 Technology Way, Norwood, Mass. 02062, under part number AD9510. The device 42 provides multi-output clock distribution with an on-chip phase-locked loop (PLL) core. The device 42 includes programmable registers 40, which are shown in FIGS. 3 and 4, to specify characteristics of the clock outputs. Table 4 below lists the register numbers and bit assignments associated with the programmable registers 40, which are used to achieve a desired frequency output. A four-bit nibble determines the number of half input clock cycles during which the corresponding clock output signal will remain low, and another four-bit nibble determines the number of half input clock cycles during which the corresponding clock output signal will remain high.

TABLE 4

| Register number | Divider number | Low cycles bits 7-4 | High cycles bits 3-0 |
|---|---|---|---|
| 48 | 0 | Low cycle bits 7-4 | High cycle bits 3-0 |
| 4A | 1 | Low cycle bits 7-4 | High cycle bits 3-0 |
| 4C | 2 | Low cycle bits 7-4 | High cycle bits 3-0 |
| 4E | 3 | Low cycle bits 7-4 | High cycle bits 3-0 |
| 50 | 4 | Low cycle bits 7-4 | High cycle bits 3-0 |
| 52 | 5 | Low cycle bits 7-4 | High cycle bits 3-0 |
| 54 | 6 | Low cycle bits 7-4 | High cycle bits 3-0 |

Based on the outputs from the frequency detector 36 shown in FIG. 3, the power management controller 34 routes the WFI signal or the CS signal to the LS or DS inputs of the memory device 16. As discussed above, in the low frequency mode of operation, the CS signal is coupled to the DS input to achieve maximum power saving. In the medium and high frequency modes of operation, based on feasibility, the CS or WFI signals are coupled to the LS or DS inputs in accordance with Table 5 below.

TABLE 5

| Mode/Output | LS | DS |
|---|---|---|
| Low | 0 | CS |
| Medium | CS | WFI |
| High | WFI | 0 |

The entries in Table 5 vary based on sleep timing parameters of the particular memory device being implemented.

Figure 5:
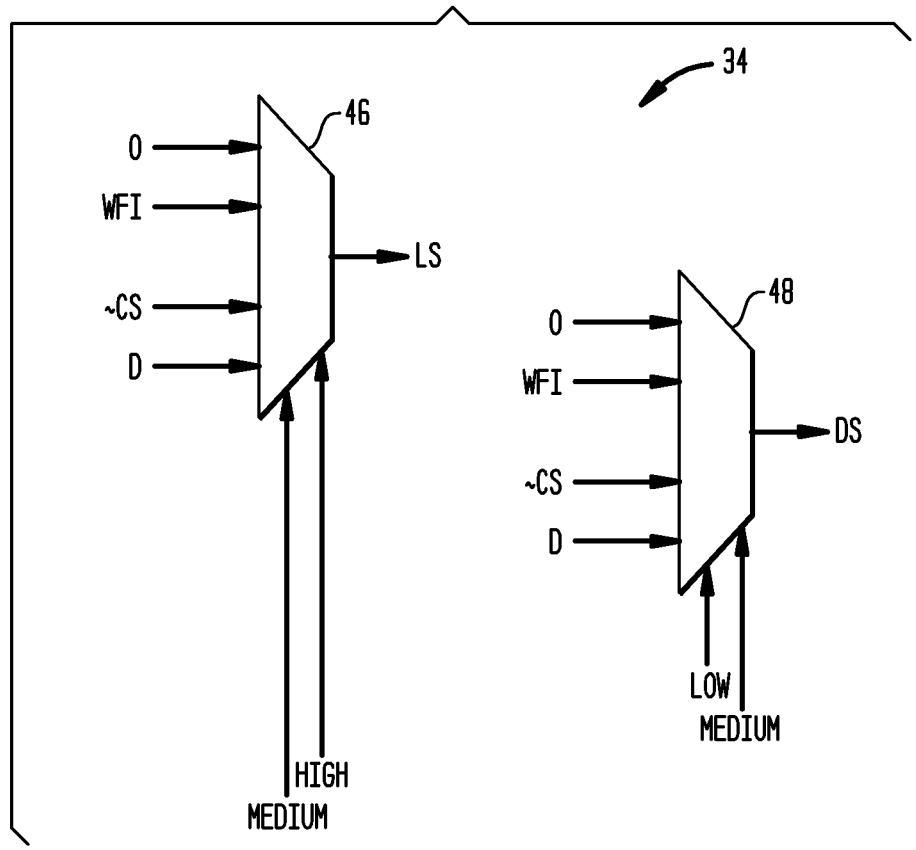
FIG. 5 is a block diagram of a circuit embodiment for power mode selection.

The truth table of Table 5 above can be converted to a circuit implementation shown in FIG. 5. Two multiplexers 46, 48, which are implemented in the power management controller 34 selectively route the ~CS signal and the WFI signal outputs to the LS and DS inputs of the memory device based on the mode of operation in response to the low, medium, and high frequency range signals from the frequency detector 36 in accordance with Table 5.

Figure 6:
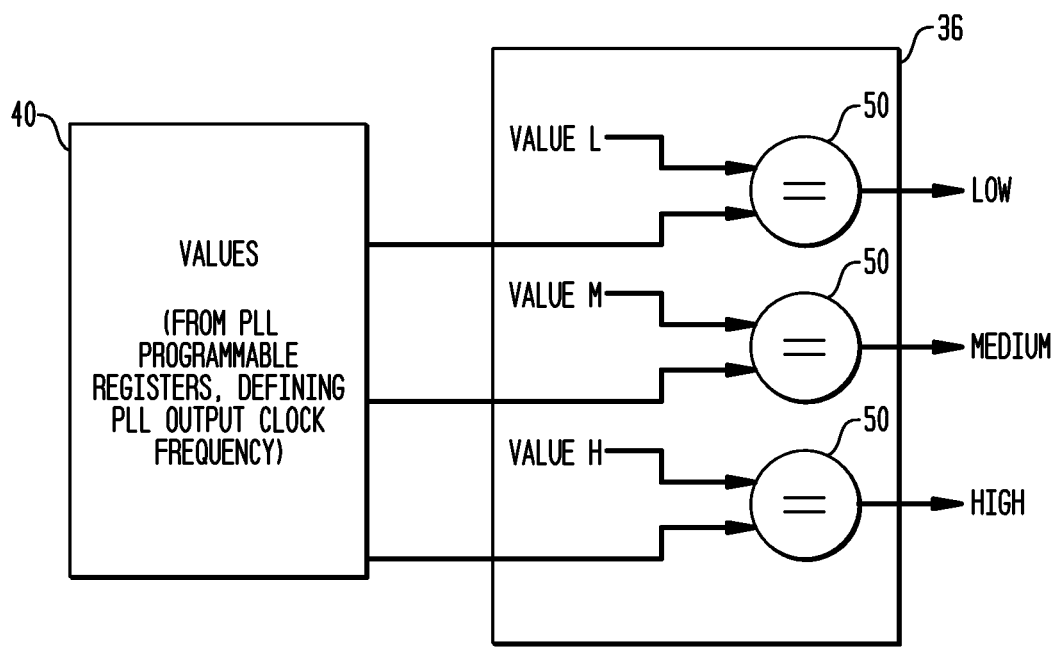
FIG. 6 is a block diagram of a circuit embodiment for frequency range detection.

Regarding operation of the frequency detector 36 shown in FIGS. 3 and 6, the PLL clock output frequencies are programmed to output, for example, one of three frequency range modes (low, medium, and high frequency modes) by programming the PLL registers 40 of the PLL 38. The values of the PLL registers 40 are used by the frequency detector 36 to determine the frequency range mode of operation by comparing these values to predetermined values (Value L, Value M, and Value H) of the PLL registers 40 corresponding to the low, medium, and high frequency range modes of operation as shown in FIG. 6. For example, "Value L" represents a predetermined value that can be used to divide the PLL output clock to derive a low frequency clock signal output; "Value M" represents a predetermined value that can be used to divide the PLL output clock signal to derive the medium frequency clock; and "Value H" represents a predetermined value that can be used to divide the PLL output clock signal to derive the high frequency clock signal. The comparators 50 shown in FIG. 6 are included in the frequency detector 36 to perform these functions.

It is to be understood that various alternative embodiments can be implemented while remaining within the scope of the subject disclosure. For example, alternatives including, but not limited to, the following are considered to be within the intended scope:

a. different control signals, in addition to and/or as a substitute for the CS and WFI output signals, are used to control the power modes associated with the memory device;

b. different power modes associated with the memory device are controlled;

c. the frequency information associated with the processing device is obtained by alternative devices and/or methods, such as frequency or phase detection using voltage controlled oscillators and filters; and d. the relationships between the operational modes (low, medium, high), control signal inputs (CS, WFI), and power mode control signal outputs (LS, DS) shown in Table 5 are modified, supplemented, and/or simplified.

Figure 7:
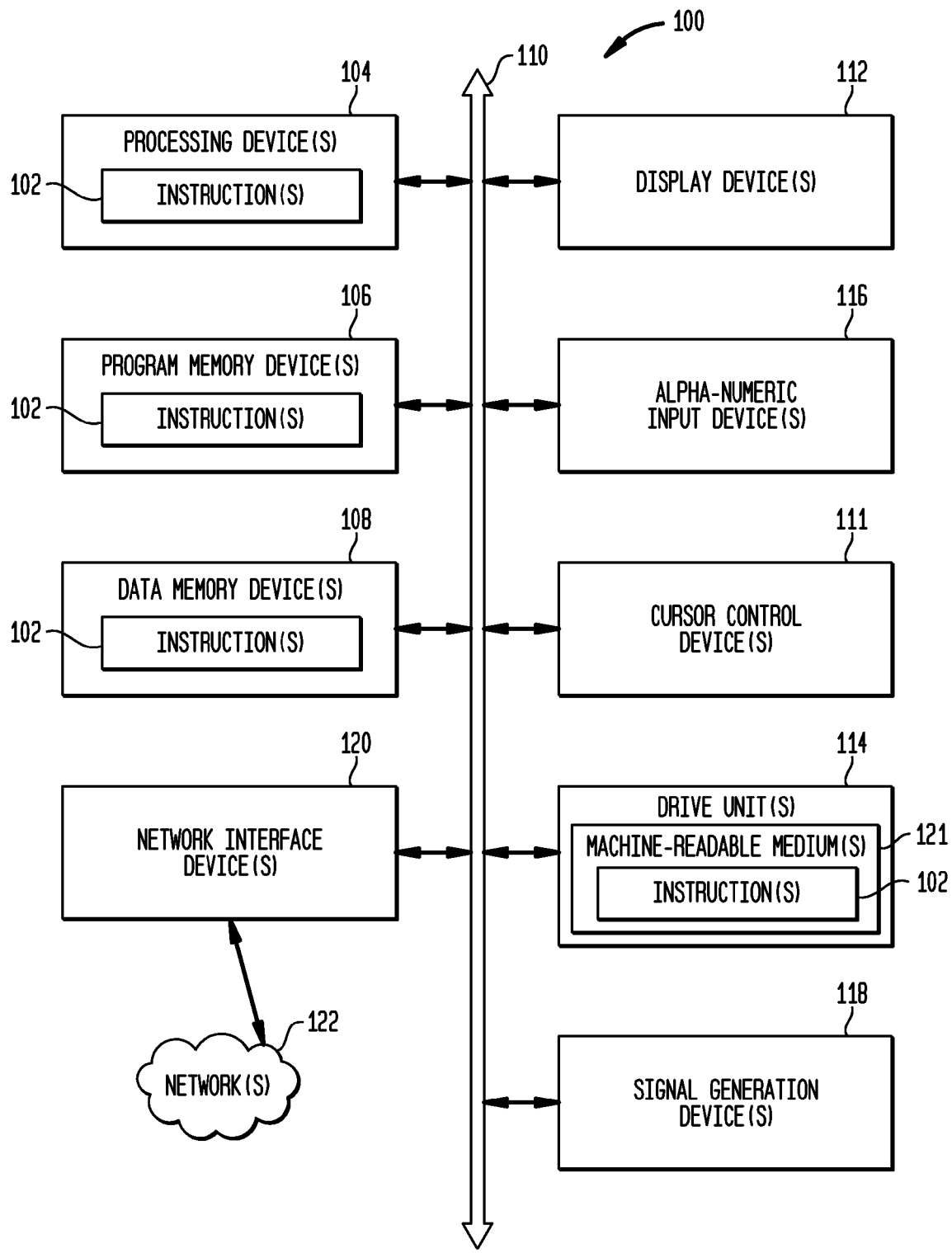
FIG. 7 is a block diagram of an embodiment of a machine in the form of a computing system configured to perform the disclosed methods.

FIG. 7 is a block diagram of an embodiment of a machine in the form of a computing system 100, within which is a set of instructions 102, that when executed, cause the machine to perform any one or more of the methods disclosed herein. In some embodiments, the machine operates as a standalone device. In some embodiments, the machine is connected (e.g., using a network) to other machines. In a networked implementation, the machine operates in the capacity of a server or a client user machine in a server-client user network environment. The machine includes a server computer, client user computer, personal computer (PC), tablet PC, personal digital assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that machine.

The computing system 100 includes a processing device(s) 104 (e.g., a central processing unit (CPU), a graphics processing unit (GPU), or both), program memory device(s) 106, and data memory device(s) 108, which communicate with each other via a bus 110. The computing system 100 further includes display device(s) 112 (e.g., a liquid crystals display (LCD), flat panel, solid state display, or cathode ray tube (CRT)). The computing system 100 includes input device(s) 116 (e.g., a keyboard), cursor control device(s) 111 (e.g., a mouse), disk drive unit(s) 114, signal generation device(s) 118 (e.g., a speaker or remote control), and network interface device(s) 120.

The disk drive unit(s) 114 includes machine-readable medium/media 121, on which is stored one or more sets of instructions 102 (e.g., software) embodying any one or more of the methods or functions disclosed herein, including those methods illustrated herein. The instructions 102 also reside, completely or at least partially, within the program memory device(s) 106, the data memory device(s) 108, and/or within the processing device(s) 104 during execution thereof by the computing system 100. The program memory device(s) 106 and the processing device(s) 104 also constitute machine-readable medium/media. Dedicated hardware implementations, such as but not limited to application specific integrated circuits, programmable logic arrays, and other hardware devices can likewise be constructed to implement the methods described herein. Applications that include the apparatus and systems of various embodiments broadly include a variety of electronic and computer systems. Some embodiments implement functions in two or more specific interconnected hardware modules or devices with related control and data signals communicated between and/or through the modules, or as portions of an application-specific integrated circuit. Thus, the example system is applicable to software, firmware, and/or hardware implementations.

In accordance with various embodiments, the methods, functions, or logic described herein are implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to distributed processing, component/object distributed processing, parallel processing, or virtual machine processing can also be constructed to implement the methods, functions, or logic described herein.

The embodiments contemplate machine-readable medium or computer-readable medium containing instructions 102, or that which receives and executes instructions 102 from a propagated signal so that a device connected to a network environment 122 can send or receive voice, video, or data, and communicate over the network 122 using the instructions 102. The instructions 102 are further transmitted or received over a network 122 via the network interface device(s) 120. The machine-readable medium also contains a data structure for storing data useful in providing a functional relationship between the data and a machine or computer in an illustrative embodiment of the disclosed systems and methods.

While the machine-readable medium 121 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that causes the machine to perform any one or more of the methods of the disclosed embodiments. The term "machine-readable medium" shall accordingly be taken to include, but not be limited to, solid-state memories, such as a memory card or other package that houses one or more read-only (non-volatile) memories, random access memories, or other re-writable (volatile or non-volatile) memories; magneto-optical or optical medium, such as a disk or tape; and/or a digital file attachment to e-mail or other self-contained information archive or set of archives considered a distribution medium equivalent to a tangible storage medium. Accordingly, the disclosed embodiments are considered to include any one or more of a tangible machine-readable medium or a tangible distribution medium, as listed herein, as well as art-recognized equivalents and successor media, in which the software implementations herein are stored.

Although the specification describes components and functions implemented in the embodiments with reference to particular standards and protocols, the disclosed embodiment are not limited to such standards and protocols.

The illustrations of embodiments described herein are intended to provide a general understanding of the structure of various embodiments, and are not intended to serve as a complete description of all the elements and features of apparatus and systems that make use of the structures described herein. Many other embodiments will be apparent to those skilled in the art upon reviewing the disclosures herein. Other embodiments are utilized and derived therefrom, such that structural and logical substitutions and changes are made without departing from the scope of this disclosure. Figures are also merely representational and not necessarily drawn to scale. Certain proportions thereof are exaggerated, while others are reduced. Accordingly, the specification and drawings are to be regarded in an illustrative rather than a restrictive sense.

Such embodiments of the inventive subject matter are referred to herein, individually and/or collectively, by the term "embodiment" merely for convenience and without intending to voluntarily limit the scope of this application to any single embodiment or inventive concept if more than one is in fact disclosed. Thus, although specific embodiments have been illustrated and described herein, it should be appreciated that any arrangement calculated to achieve the same purpose is substituted for the specific embodiments shown. This disclosure is intended to cover any and all adaptations or variations of various embodiments. Combinations of the above embodiments, and other embodiments not specifically described herein, will be apparent to those skilled in the art upon reviewing the above description.

The Abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter disclosed herein. Accordingly, the specification and drawings are to be regarded in an illustrative rather than a restrictive sense. The accompanying drawings that form a part hereof, show by way of illustration, and without limitation, specific embodiments in which the subject matter is practiced. The embodiments illustrated are described in sufficient detail to enable those skilled in the art to practice the teachings disclosed herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings of the invention provided herein, one of ordinary skill in the art will be able to contemplate other implementations and applications of the techniques of the invention. Although illustrative embodiments of the invention have been described herein with reference to the accompanying drawings, it is to be understood that the invention is not limited to those precise embodiments, and that various other changes and modifications are made therein by one skilled in the art without departing from the scope of the claims.

What is claimed is:

1. A method of controlling a power mode associated with a memory device, the method comprising:

providing a power mode control signal, the power mode control signal being responsive to a control signal and frequency information, the control signal being provided by a processing device, the processing device being operatively coupled to the memory device, the frequency information being associated with a clock signal, the clock signal being used to operate the processing device, the power mode control signal being operative to control the power mode associated with the memory device; and coupling a first signal with a light sleep input associated with the memory device, the first signal being selected in response to the frequency information representing a first frequency range, and coupling a second signal with a deep sleep input associated with the memory device, the second signal being selected in response to the frequency information representing a second frequency range, wherein the first and second signals are different.

2. The method of controlling a power mode associated with a memory device defined by claim 1, wherein the control signal comprises at least one of a chip select (CS) signal and a wait-for-interrupt (WFI) signal.

3. The method of controlling a power mode associated with a memory device defined by claim 1, wherein the frequency information represents at least one of a low frequency range, a medium frequency range, and a high frequency range.

4. The method of controlling a power mode associated with a memory device defined by claim 3, wherein the low frequency range represents a frequency range of about 100 MHz to 300 MHz, the medium frequency range represents a frequency range of about 300 MHz to 700 MHz, and the high frequency range represents a frequency range starting at about 700 MHz.

5. The method of controlling a power mode associated with a memory device defined by claim 1, further comprising:
coupling, operatively, a ground signal to the light sleep (LS) input associated with the memory device in response to the frequency information representing a low frequency range; and
coupling, operatively, a chip select (CS) signal to the deep sleep (DS) input associated with the memory device in response to the frequency information representing the low frequency range.

6. The method of controlling a power mode associated with a memory device defined by claim 1, further comprising:
coupling, operatively, a chip select (CS) signal to the light sleep (LS) input associated with the memory device in response to the frequency information representing a medium frequency range; and
coupling, operatively, a wait-for-interrupt (WFI) signal to the deep sleep (DS) input associated with the memory device in response to the frequency information representing the medium frequency range.

7. The method of controlling a power mode associated with a memory device defined by claim 1, further-comprising:
coupling, operatively, a wait-for-interrupt (WFI) signal to the light sleep (LS) input associated with the memory device in response to the frequency information representing a high frequency range; and
coupling, operatively, a ground signal to the deep sleep (DS) input associated with the memory device in response to the frequency information representing the high frequency range.

8. A non-transitory computer-readable medium comprising instructions that, when executed by a processing device, perform a computer process that controls a power mode associated with a memory device, the computer process comprising:
providing a power mode control signal, the power mode control signal being responsive to a control signal and frequency information, the control signal being provided by a processing device, the processing device being operatively coupled to the memory device, the frequency information being associated with a clock signal, the clock signal being used to operate the processing device, the power mode control signal being operative to control the power mode associated with the memory device; and
coupling a first signal with a light sleep input associated with the memory device, the first signal being selected in response to the frequency information representing a first frequency range, and coupling a second signal with a deep sleep input associated with the memory device, the second signal being selected in response to the frequency information representing a second frequency range, wherein the first and second signals are different.

9. The non-transitory computer-readable medium defined by claim 8, wherein the control signal comprises at least one of a chip select (CS) signal and a wait-for-interrupt (WFI) signal.

10. The non-transitory computer-readable medium defined by claim 8, wherein the frequency information represents at least one of a low frequency range, a medium frequency range, and a high frequency range.

11. The non-transitory computer-readable medium defined by claim 10, wherein the low frequency range represents a frequency range of about 100 MHz to 300 MHz, the medium frequency range represents a frequency range of about 300 MHz to 700 MHz, and the high frequency range represents a frequency range starting at about 700 MHz.

12. The non-transitory computer-readable medium defined by claim 8, wherein the computer process further comprises:
coupling, operatively, a ground signal to the light sleep (LS) input associated with the memory device in response to the frequency information representing a low frequency range; and
coupling, operatively, a chip select (CS) signal to the deep sleep (DS) input associated with the memory device in response to the frequency information representing the low frequency range.

13. The non-transitory computer-readable medium defined by claim 8, wherein the computer process further comprises:
coupling, operatively, a chip select (CS) signal to the light sleep (LS) input associated with the memory device in response to the frequency information representing a medium frequency range; and
coupling, operatively, a wait-for-interrupt (WFI) signal to the deep sleep (DS) input associated with the memory device in response to the frequency information representing the medium frequency range.

14. The non-transitory computer-readable medium defined by claim 8, wherein the computer process further comprises:
coupling, operatively, a wait-for-interrupt (WFI) signal to the light sleep (LS) input associated with the memory device in response to the frequency information representing a high frequency range; and
coupling, operatively, a ground signal to the deep sleep (DS) input associated with the memory device in response to the frequency information representing the high frequency range.

15. A power management controller configured to control a power mode associated with a memory device, the power management controller comprising at least one device configured: to provide a power mode control signal, the power mode control signal being responsive to a control signal and frequency information, the control signal being provided by a processing device operatively coupled to the memory device, the frequency information being associated with a clock signal used to operate the processing device, the power mode control signal being operative to control the power mode associated with the memory device; and to couple a first signal with a light sleep input associated with the memory device, the first signal being selected in response to the frequency information representing a first frequency range, and coupling a second signal with a deep sleep input associated with the memory device, the second signal being selected in response to the frequency information representing a second frequency range, wherein the first and second signals are different.

16. The power management controller defined by claim 15, wherein the control signal comprises at least one of a chip select (CS) signal and a wait-for-interrupt (WFI) signal.

17. The power management controller defined by claim 15, wherein the frequency information represents at least one of a low frequency range, a medium frequency range, and a high frequency range.

18. The power management controller defined by claim 17, wherein the low frequency range represents a frequency range of about 100 MHz to 300 MHz, the medium frequency range represents a frequency range of about 300 MHz to 700 MHz, and the high frequency range represents a frequency range starting at about 700 MHz.

19. The power management controller defined by claim 15, wherein the device is configured to:
couple, operatively, a ground signal to the light sleep (LS) input associated with the memory device in response to the frequency information representing a low frequency range; and couple, operatively, a chip select (CS) signal to the deep sleep (DS) input associated with the memory device in response to the frequency information representing the low frequency range.

20. The power management controller defined by claim 15, wherein the device is configured to:
couple, operatively, a chip select (CS) signal to the light sleep (LS) input associated with the memory device in response to the frequency information representing a medium frequency range; and
couple, operatively, a wait-for-interrupt (WFI) signal to the deep sleep (DS) input associated with the memory device in response to the frequency information representing the medium frequency range.

21. The power management controller defined by claim 15, wherein the device is configured to:
couple, operatively, a wait-for-interrupt (WFI) signal to the light sleep (LS) input associated with the memory device in response to the frequency information representing a high frequency range; and
couple, operatively, a ground signal to the deep sleep (DS) input associated with the memory device in response to the frequency information representing the high frequency range.

22. An electronic system, comprising:
a processing device;
a memory device operatively coupled to the processing device; and
a power management controller configured to control a power mode associated with the memory device, the power management controller comprising at least one device configured: to provide a power mode control signal, the power mode control signal being responsive to a control signal and frequency information, the control signal being provided by the processing device, the frequency information being associated with a clock signal used to operate the processing device, the power mode control signal being operative to control the power mode associated with the memory device; and to couple a first signal with a light sleep input associated with the memory device, the first signal being selected in response to the frequency information representing a first frequency range, and coupling a second signal with a deep sleep input associated with the memory device, the second signal being selected in response to the frequency information representing a second frequency range, wherein the first and second signals are different.

23. A method of controlling a power mode associated with a memory device, the method comprising:
providing a power mode control signal, the power mode control signal being responsive to a control signal and frequency information, the control signal being provided by a processing device, the processing device being coupled with the memory device, the frequency information being associated with a clock signal, the clock signal being used to operate the processing device, the power mode control signal being operative to control the power mode associated with the memory device; and
performing at least one of:
in response to the frequency information representing the low frequency range, coupling a ground signal with a light sleep (LS) input associated with the memory device and coupling a chip select (CS) signal with a deep sleep (DS) input associated with the memory device;
in response to the frequency information representing a medium frequency range, coupling the CS signal with the LS input associated with the memory device and coupling a wait-for-interrupt (WFI) signal with the DS input associated with the memory device; and
in response to the frequency information representing a high frequency range, coupling the WFI signal with the LS input associated with the memory device and coupling a ground signal to the DS input associated with the memory device.

24. A power management controller configured to control a power mode associated with a memory device, the power management controller comprising:
at least one device operative to provide a power mode control signal, the power mode control signal being responsive to a control signal and frequency information, the control signal being provided by a processing device operatively coupled to the memory device, the frequency information being associated with a clock signal used to operate the processing device, the power mode control signal being operative to control the power mode associated with the memory device;
wherein the device is configured to perform at least one of:
in response to the frequency information representing a low frequency range, couple a ground signal with a light sleep (LS) input associated with the memory device and couple a chip select (CS) signal with a deep sleep (DS) input associated with the memory device;
in response to the frequency information representing a medium frequency range, couple the CS signal to the LS input associated with the memory device and couple a wait-for-interrupt (WFI) signal with the DS input associated with the memory device; and
in response to the frequency information representing a high frequency range, couple the WFI signal with the LS input associated with the memory device and couple a ground signal with the DS input associated with the memory device.

* * * * *